United States Patent
Wang et al.

(10) Patent No.: US 10,892,777 B2
(45) Date of Patent: Jan. 12, 2021

(54) FAST ERROR RECOVERY WITH ERROR CORRECTION CODE (ECC) SYNDROME WEIGHT ASSIST

(71) Applicant: Seagate Technology LLC, Cupertino, CA (US)

(72) Inventors: Zheng Wang, Louisville, CO (US); Ara Patapoutian, Hopkinton, MA (US); Ryan James Goss, Prior Lake, MN (US); Antoine Khoueir, Apple Valley, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/269,051

(22) Filed: Feb. 6, 2019

(65) Prior Publication Data

US 2020/0252079 A1 Aug. 6, 2020

(51) Int. Cl.
| H03M 13/11 | (2006.01) |
| H03M 13/15 | (2006.01) |
| G06F 11/10 | (2006.01) |

(52) U.S. Cl.
CPC ..... *H03M 13/1117* (2013.01); *G06F 11/1044* (2013.01); *H03M 13/1125* (2013.01); *H03M 13/1128* (2013.01); *H03M 13/1575* (2013.01)

(58) Field of Classification Search
CPC ......... H03M 13/1125; H03M 13/1128; H03M 13/1142; H03M 13/116; H03M 13/451; H03M 13/1117
See application file for complete search history.

(56) References Cited

U.S. PATENT DOCUMENTS

| 7,191,378 B2 | 3/2007 | Eroz et al. |
| 7,562,279 B2 | 7/2009 | Zhang et al. |
| 7,911,364 B1 | 3/2011 | Zhang et al. |

(Continued)

OTHER PUBLICATIONS

Ahmed A. Emran and Maha Elsabrouty, "Generalized Simplified Variable-Scaled Min Sum LDPC decoder for irregular LDPC Codes," Electronics and Electrical Communications, 5 pps., Egypt-Japan University for Science and Technology, Alexandria, Egypt, Sep. 2014.

(Continued)

*Primary Examiner* — Shelly A Chase
(74) *Attorney, Agent, or Firm* — Hall Estill Attorneys at Law (57) ABSTRACT

Method and apparatus for decoding error correction code (ECC) code words. Reference voltages are used to extract a selected code word from a communication channel. The selected code word is processed by an ECC decoder, and an initial syndrome weight is determined indicative of unresolved parity errors. A coarse search operates to concurrently adjust, over a first succession of iterations, each of the reference voltages. A subsequent fine search operates, over a second succession of iterations, to individually adjust the reference voltages. Decoding and syndrome weight determination continues over each iteration until a minimum syndrome weight is obtained, after which a user data content of the code word is decoded. The coarse search may transition the decoder from a saturated operational region to a linear operational region. The decoder may be a low density parity check (LDPC) decoder.

21 Claims, 8 Drawing Sheets

(56) References Cited

U.S. PATENT DOCUMENTS

| | | | |
|---|---|---|---|
| 7,934,139 B2 | 4/2011 | Andreev et al. | |
| 8,201,051 B2 | 6/2012 | Tan et al. | |
| 8,351,258 B1 | 1/2013 | Yang et al. | |
| 8,484,531 B1 | 7/2013 | Varnica et al. | |
| 8,543,883 B2 | 9/2013 | Chen et al. | |
| 8,566,665 B2 | 10/2013 | Li | |
| 8,645,810 B2 | 2/2014 | Sharon et al. | |
| 8,650,451 B2 | 2/2014 | Krishnan et al. | |
| 8,656,249 B2 | 2/2014 | Chen et al. | |
| 8,709,863 B2 | 4/2014 | Varnica et al. | |
| 8,769,382 B1 | 7/2014 | Varnica et al. | |
| 8,799,742 B1* | 8/2014 | Zhang ............... | H03M 13/1128 714/759 |
| 8,862,961 B2 | 10/2014 | Zhang et al. | |
| 8,879,640 B2 | 11/2014 | Chow et al. | |
| 8,930,788 B2 | 1/2015 | Zhang et al. | |
| 9,015,547 B2 | 4/2015 | Wang et al. | |
| 9,048,870 B2 | 6/2015 | Li et al. | |
| 9,059,742 B1 | 6/2015 | Anderson et al. | |
| 9,256,487 B1 | 2/2016 | Varnica et al. | |
| 9,473,175 B1 | 10/2016 | Granmann et al. | |
| 9,697,075 B2* | 7/2017 | Tate ................... | G06F 11/1068 |
| 2005/0283707 A1 | 12/2005 | Sharon et al. | |
| 2010/0042903 A1 | 2/2010 | Gunnam | |
| 2010/0269016 A1 | 10/2010 | Ware | |
| 2012/0221914 A1 | 8/2012 | Morero et al. | |
| 2013/0061114 A1 | 3/2013 | Malmirchegini et al. | |
| 2013/0212447 A1 | 8/2013 | Li et al. | |
| 2014/0053037 A1 | 2/2014 | Wang et al. | |
| 2014/0089757 A1 | 3/2014 | Yang et al. | |
| 2014/0143628 A1 | 5/2014 | Li et al. | |
| 2015/0372695 A1 | 12/2015 | Li et al. | |
| 2016/0191079 A1 | 6/2016 | Zuo et al. | |
| 2017/0026055 A1 | 1/2017 | Wu | |

OTHER PUBLICATIONS

Ahmed A. Emran and Maha Elsabrouty, "Simplified Variable-Scaled Min Sum LDPC decoder for irregular LDPC Codes," Electronics and Communications Engineering Department, 6 pps., Egypt-Japan University for Science and Technology, Alexandria, Egypt, Jan. 2014.

Kiran K. Gunnam, Gwan S. Choi, Weihuang Wang and Mark B Yeary, "A Parallel VLSI Architecture for Layered Decoding," pp. 1-54, 2007.

Ahmed A. Hamad, "Estimation of Two-Dimensional Correction Factors for Min-Sum Decoding of Regular LDPC Code," Wireless Engineering and Technology, 2013, pp. 181-187, 4, Scientific Research.

Yongmin Jung, Yunho Jung, Seongjoo Lee and Jaeseck Kim, "New Min-Sum LDPC Decoding Algorithm Using SNR-Considered Adaptive Scaling Factors," ETRI Journal, Aug. 2014, pp. 591-598, vol. 36. No. 4.

Marjan Karkooti, Predrag Radosavljevic and Joseph R. Cavallaro, "Configurable, High Throughput, Irregular LDPC Decoder Architecture: Tradeoff Analysis and Implementation," Department of Electrical and Computer Engineering, Rice University, 8 pps., Houston, Texas, Sep. 13, 2006.

Tom Richardson, "Error Floors of LDPC Codes," pp. 1426-1435, Flarion Technologies, Bedminster, Jersey, Oct. 2003.

Geo Niju Shanth and Saru Priya, "Low Complexity Implementation of LDPC Decoder Using MIN-Sum Algorithm," International Journal of Computer Applications, 2013, International Conference on Innovations in Intelligent Instrumentation, Optimization and Signal Processing, Velammal Engineering College, Chennai.

Juntan Zhang, Marc Fossorier, Daqing Gu and Jinyun Zhang, "Improved Min-Sum Decoding of LDPC Codes Using 2-Dimensional Normalization," Mitsubishi Electric Research Laboratories, Inc., Jun. 2006, 7 pps., Cambridge, Massachusetts.

Juntan Zhang, Marc Fossorier, Daqing Gu and Jinyun Zhang, "Two-Dimensional Correction for Min-Sum Decoding of Irregular LDPC Codes," Mitsubishi Electric Research Laboratories, Inc., Jun. 2006, 4 pps., Cambridge, Massachusetts.

Zhengya Zhang, Lara Dolecek, Martin Wainwright, Venkat Anantharam and Borivoje Nikolic, "Quantization Effects in Low-Density Parity-Check Decoders," IEEE, 2007, pp. 6231-6237.

Xiaojie Zhang and Paul H. Siegel, "Quantized Min-Sum Decoders with Low Error Floor for LDPC Codes," IEEE, 2012, pp. 2871-2875.

Hao Zhong, Wei Xu, Ningde Xie and Tong Zhang, "Area-Effecient Min-Sum Decoder Design for High-Rate QC-LDPC Codes in Magnetic Recording," 2007.

N. Kanistras, I. Tsatsaragkos, I. Paraskevakos, A. Mahdi and V. Paliouras, "Impact of LLR Saturation and Quantization on LDPC Min-Sum Decoders," 2010 IEEE Workshop on Signal Processing Systems, 2010, pp. 410-415, San Francisco, CA.

* cited by examiner

SSD STORAGE DEVICE

FIG. 15

HDD/HYBRID STORAGE DEVICE

FIG. 16

FAST ERROR RECOVERY WITH ERROR CORRECTION CODE (ECC) SYNDROME WEIGHT ASSIST

SUMMARY

Various embodiments are generally directed to decoding data in a communication channel that employs an error correction code (ECC) decoder, such as but not limited to a low density parity check (LDPC) decoder.

In some embodiments, at least two reference voltages are used to extract a selected code word from a communication channel, such as a location in memory. The selected code word is processed by an ECC decoder, and an initial syndrome weight is determined indicative of unresolved parity errors. A coarse search operates to concurrently adjust, over a first succession of iterations, each of the at least two reference voltages. A subsequent fine search operates, over a second succession of iterations, to individually adjust each of the at least two reference voltages. Decoding and syndrome weight determination continues over each iteration until a minimum syndrome weight is obtained, after which a user data content of the code word is decoded. The coarse search may transition the decoder from a saturated operational region to a linear operational region. The decoder may be a low density parity check (LDPC) decoder.

These and other features and advantages which may characterize various embodiments can be understood in view of the following detailed discussion and the accompanying drawings.

DETAILED DESCRIPTION

The present disclosure generally relates to the decoding of data in a communication channel that uses an error correction code (ECC) decoder circuit.

Error correction codes (ECC) are used to provide reliable delivery of digital data over communication channels. A variety of ECC schemes can be employed to detect and correct bit errors in a received data packet (e.g., code word).

Low Density Parity Check (LDPC) codes are a particular form of ECC codes that are useful in the transmission of data. As with other forms of ECC codes, LDPC codes take the form of code words having both an informational component (e.g., user data bits) and a redundant component (e.g., error correcting bits) for error correction. A common convention is to describe LDPC code words as k/n codes, where n represents the total number of bits, k represents the number of user bits, and n-k represents the number of redundant bits.

A number of industry standards have been enacted to facilitate LDPC code transmissions over wireless and wired interfaces. Because LDPC codes have a robust ability to handle high speed transmission of data in a noisy environment at or near the theoretical capacity of the transmission capability of the interface, LDPC codes are often used in high data I/O communication channels, including but not limited to data storage devices such as solid state drives (SSDs), hard disc drives (HDDs), hybrid solid state drives (HSSDs), etc.

An LDPC decoder is a type of circuit used to decode LDPC codes. An LDPC decoder often employs a number of variable nodes (also sometimes referred to as variable node units, VNUs) and check nodes (or check node units, CNUs). The variable nodes generate and/or store potential code bits. The check nodes perform parity checks upon different combinations of the contents of the variable nodes using combinatorial logic functions. LDPC may be realized as hardware circuits with gate logic, or via one or more programmable processor circuits with associated program instructions in memory.

An input code word is successfully decoded if all the parity constraints of the check nodes are met. If one or more errors are detected, subsequent iterations are carried out, including through the use of soft information that gives further information regarding the state of the code word. Each iteration involves messages being sent between the various units. Messages from the variable nodes to the check nodes may be referred to as v2c or r messages, and messages from the check nodes to the variable nodes may be referred to as c2v or q messages. Other notations may be used, such as P and Q messages, etc.

A syndrome, or syndrome weight, describes the state of the LDPC decoder at any given iteration during a decoding operation. The syndrome weight is generally representative of the number of check nodes that are non-resolved, that is, the number of check nodes that do not meet the required parity check for the associated variable node contents. If the syndrome weight reaches zero, that means that all of the bits in the code word have been successfully decoded and the code word can be output for further processing by the channel. A syndrome weight of any number greater than zero indicates bit errors are still present in the variable nodes, and further processing by the LDPC decoder may be required. It will be appreciated that syndrome weights can be determined for other forms of ECC decoders, and provide the same general form of information, namely, an indication of the general number of remaining bit errors in a given data block. Operational performance of an LDPC decoder is highly dependent on channel noise.

A graph of observed bit error rate (BER) to signal to noise ratio (SNR) shows a steep improvement in BER as noise in the channel is reduced. This is sometimes referred to as a waterfall region and exhibits an exponential slope. At very low levels of noise, the response of the LDPC decoder flattens out to form a so-called error floor, which is a shoulder portion of the graph that exhibits a very shallow slope. One reason for the change in slope at the error floor is that, as the number of errors present decreases to a very small value (e.g., the syndrome weight becomes very small), it can sometimes become increasingly difficult to resolve the remaining errors, particularly for certain bit error combinations (trapping sets) that involve bit symmetries that can resist easy resolution.

At the opposite end of the spectrum, a large syndrome weight generally indicates there are many errors in the input code word; in some cases, too many errors for the LDPC decoder to resolve properly. For example, a very large syndrome weight may be produced if the reference voltages (VREF) used to detect bits in a flash memory are not set correctly so that there are many misread bits in the input code word from the memory. There are other sources for large syndrome weights as well.

In many LDPC designs, the relationship between actual bit errors in a given code word and the associated syndrome weight is more or less linear for a large mid-range of syndrome weights. However, this relationship may become saturated when syndrome weights exceed a certain threshold. Thus, just as it can be difficult to decode code words with very small syndrome weights due to trapping sets, it can also be very difficult to decode code words with very high syndrome weights due to saturation.

Various embodiments of the present disclosure provide an apparatus and method to enhance operation of an ECC decoder, such as but not limited to an LDPC decoder. As explained below, some embodiments operate the ECC decoder as a portion of a data recovery channel for data storage in a non-volatile memory (NVM), although such is not necessarily required.

Generally, at least two reference voltages (VREFs) are applied to retrieve a first code word. In the context of an NVM, the VREFs may be used to distinguish the bit values (e.g., logical 0 or 1) of various stored bits in the NVM. The ECC decoder may be an LDPC decoder that uses a plurality of variable nodes and a plurality of check nodes to perform a first pass at decoding the first code word.

A syndrome weight is determined at the conclusion of the first pass for the first retrieved code word. The syndrome weight will have a magnitude indicative of a total number of remaining errors in the decoded code word; in the context of an LDPC decoder, the syndrome weight may indicate the total number of check nodes that have unresolved parity errors. Syndrome weights can be calculated in other ways for other forms of ECC decoders.

If the syndrome weight for the first code word exceeds a predetermined threshold, a fast recovery operation may be enacted. The fast recovery operation includes a coarse search mode, followed by a fine search mode.

During the coarse search mode, each of the at least two VREF values will be incremented concurrently. The VREF values may be adjusted by the same amount and in the same direction (polarity), or the VREF values may be adjusted by different amounts with the same or different polarities. A new code word will be re-read using the new VREF values, and a new syndrome weight will be calculated. This process will continue as additional concurrent increments will be applied to each of the VREFs during each pass until certain criteria are met. It is contemplated that the increments will be relatively large and will tend to result in significant reductions in the syndrome weight over each successive iteration.

At such time that a set of concurrently adjusted VREF values are found to provide a minimum syndrome weight, the system switches to a fine search mode of operation. While not necessarily required, it is contemplated that the coarse search will have brought the decoder into, or near, the linear region. In some cases, the coarse search mode will continue until a syndrome weight is found that is below a predetermined threshold. In other cases, a total number of iterations will take place and the set of concurrently adjusted VREF values that provided the minimum syndrome weight will be selected.

During the fine search mode, each of the VREF values are individually adjusted to further tune the VREF values to final values that generate the code word in a resolvable state. During the fine search mode, one of the VREF values will be adjusted while the remaining VREF value(s) will be maintained at a constant level. Each VREF value will be individually tuned in like manner.

Ultimately, a minimum syndrome weight will be reached at the conclusion of the fine search mode. If the syndrome weight is zero, the code word will have been successfully decoded. If the syndrome weight is non-zero, the syndrome weight will be sufficiently low using the finally selected VREF values that other resolution techniques can be applied to resolve the remaining bit errors.

It has been found that these techniques can result in significantly improved performance of an ECC decoder, including for both code words that have been recently written to a memory, and code words that have been resident for a relatively long dwell time in a memory and thus subject to significant charge drift. Empirical testing has shown that as much as a ten-time (10×) reduction in recovery time, and as much as a two-and-a-half (2.5×) reduction in the need to use higher level error correcting codes (e.g., outer codes) to resolve code bit errors, can be achieved.

Figure 1:
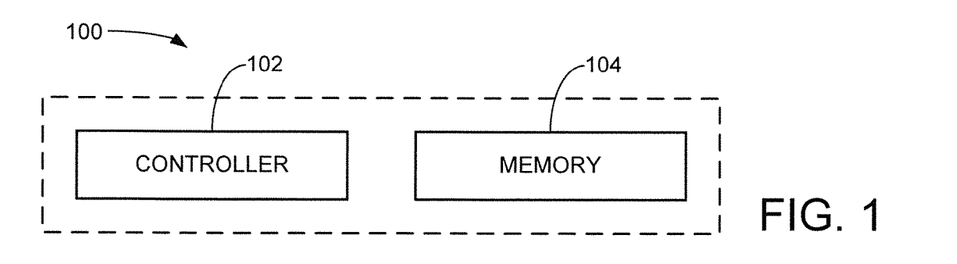
FIG. 1 provides a functional block representation of a data storage device to provide an exemplary operational environment for various embodiments of the present disclosure.

These and other features and aspects of various embodiments will be understood beginning with a review of FIG. 1 which generally illustrates an exemplary data storage device 100. The device 100 is presented to provide an exemplary environment in which the various embodiments may be advantageously practiced. The various embodiments set forth herein are not limited to data storage applications and can readily be extended to substantially any other data transmission channel that uses ECC techniques for data error resolution.

The device 100 includes a controller 102 and a memory module 104. The controller 102 provides top level control for the device 100 and may be configured as a programmable processor with associated programming in local memory. Additionally or alternatively, the controller may take the form of a hardware based control circuit with logic gates or other elements to carry out the required controller functions.

The memory module 104 can be arranged as one or more non-volatile memory (NVM) elements including rotatable magnetic recording discs and solid-state memory arrays. While a separate controller 102 is shown in FIG. 1, such is unnecessary as alternative embodiments may incorporate any requisite controller functions directly into the memory module, or external to the data storage device. While not limiting, for purposes of the present discussion it will be contemplated that the data storage device 100 is a solid-state drive (SSD) that utilizes NAND flash memory to store and retrieve user data from a host device.

Figure 2:
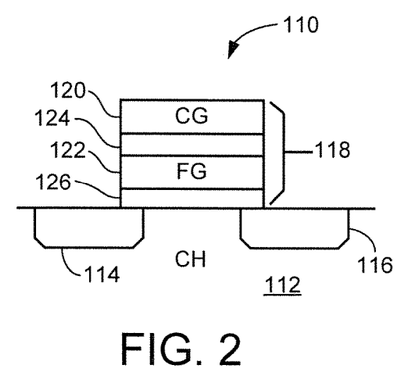
FIG. 2 depicts a flash memory cell in some embodiments.

FIG. 2 shows a schematic representation of an individual flash memory cell 110 of the memory 104 in some embodiments. The memory cell is depicted as a two-dimensional cell, although other constructions can be used including three-dimensional (stacked) cells.

The memory cell 110 is formed on a semiconductor substrate 112 and takes a general form of an n-channel MOSFET (metal oxide semiconductor field effect transistor) with drain and source regions 114, 116 separated by a channel (CH) region. A control gate structure 118 includes a control gate (CG) 120 and a floating gate (FG) 122. The floating gate 122 is electrically isolated using barrier layers 124, 126.

To program the memory cell 110, appropriate voltages are supplied to the source, drain and control gates to induce migration and accumulation of charge from the channel to floating gate 122. Different amounts of accumulated charge will alter the voltage at the control gate 120 necessary to place the cell 110 into a forward (source-drain) conductive state (e.g., "turn on" the cell). Different program states of the cell can be discerned in relation to the magnitude of the voltage necessary to turn on the cell.

Once data have been programmed to a cell, it is generally necessary to apply an erasure (erase or reset) operation to the cell before replacement data may be written to the cell. An erasure can be carried out by applying a different combination of voltages to the drain, source and gate to migrate the accumulated charge from the floating gate 122 back to the channel region of the substrate 112.

Figure 3:
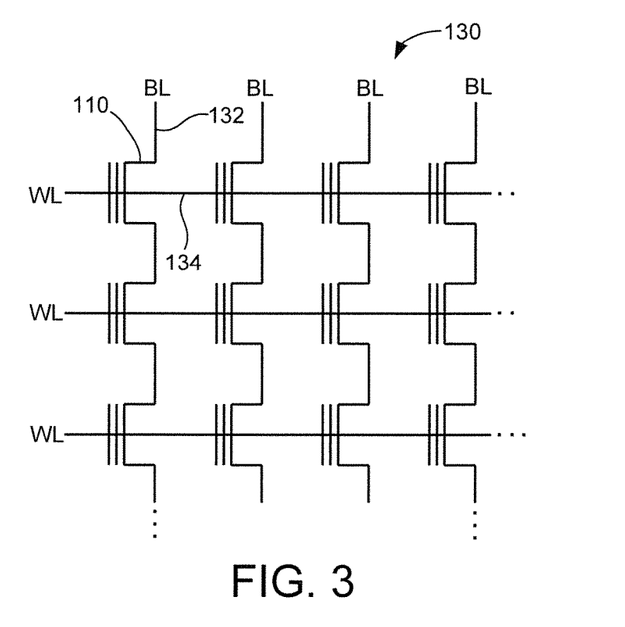
FIG. 3 shows aspects of a flash memory formed from cells such as in FIG. 2.

FIG. 3 shows a schematic depiction of an array 130 of the memory cells 110 from FIG. 3. Access to various cells are provided including using bit lines (BL) 132 and word lines (WL) 134. Generally, all of the memory cells attached to a selected word line 134 are sometimes referred to as a row of memory. Data sets are stored to the rows in the form of pages, which represent a selected number of bits corresponding to one or more code words, as explained below. Multiple pages of data may be stored to the same set of memory cells.

Figure 4:
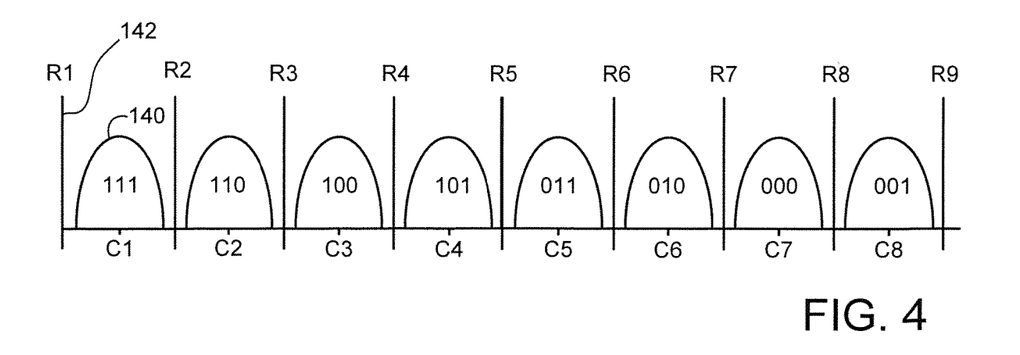
FIG. 4 illustrates different charge states to which the cells may be programmed in some embodiments.

FIG. 4 shows a number of charge distributions 140 for a population of the memory cells from FIGS. 2-3. A total of eight (8) charge distributions 140 are shown, indicating that each memory cell is configured to store three (3) bits of data. Such cells are sometimes referred to as TLCs (three-level cells). More generally, a total of 2" charge states can be used to store N bits of data. Other configurations include SLCs (single level cells) which store only a single bit, MLCs (multi-level cells) which store two bits, XLCs (quad level cells) which store four bits, etc. The TLC charge distributions 140 store data bits as follows:

TABLE 1

| Charge Distribution | Data Bits |
| --- | --- |
| C1 | 111 |
| C2 | 110 |
| C3 | 100 |

TABLE 1-continued

| Charge Distribution | Data Bits |
| --- | --- |
| C4 | 101 |
| C5 | 011 |
| C6 | 010 |
| C7 | 000 |
| C8 | 001 |

In this configuration, the most significant bit (MSB) can correspond to a bit in a first page, the intermediary significant bit (ISB) can correspond to a bit in a second page, and the least significant bit (LSB) can correspond to a data bit in a third page. Other configurations and assignments of data bits may be used as desired.

While not necessarily required, an erased set of cells may be initially programmed with a first page of data as SLCs so that the data bits in the first page generally have a charge state of either C1 (logical 1) or C5 (logical 0). A second page of data can be added to the cells so that the charge states are generally C1 (11), C3 (10), C5 (01) or C7 (00). A third page of data can be subsequently written to provide the eight charge states as shown. In other cases, the flash memory may be configured to write all three pages of data during a single programming operation, so that charge is added until the desired charge level C1-C8 is attained.

The various charge states can be discerned using one or more reference voltages (VREFs), as indicated at 142. In this case, there are a total of nine (9) reference voltages VREFs identified as R1-R9. To discern whether a particular cell is programmed as an SLC (e.g., to distinguish between charge states C1-C4 and C5-C8), the voltage references R1 and R5 may be applied. This will discern whether the leading bit is a logical 1 or a logical 0. Additional VREFs may be subsequently applied to discern other bit locations and values. As part of this sensing, it will be noted that, generally, R5 should nominally have a sufficient magnitude to place each of the cells in distributions C1-C4 in a conductive state, but R5 should not be able to make conductive any of the cells in distributions C5-C8. Contrawise, R1 should not be able to place any of the cells in a conductive state, and R9 should be able to make all of the cells conductive.

Figure 5:
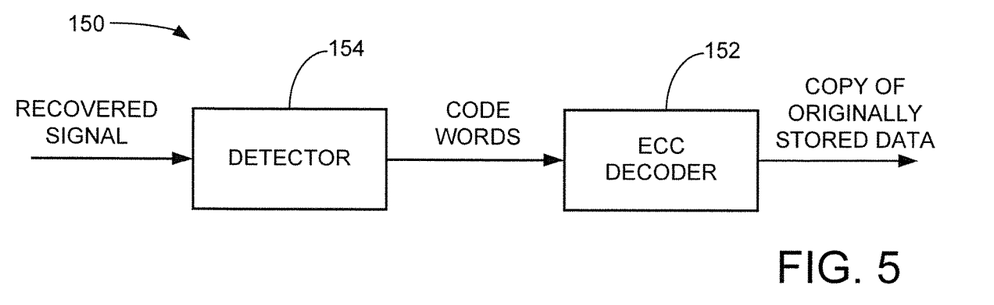
FIG. 5 is a schematic depiction of a data recovery channel that uses an error correction code (ECC) decoder to decode data in accordance with some embodiments of the present disclosure.

FIG. 5 shows a portion of a data recovery channel 150 of the device 100. The channel 150 uses an error detection code (ECC) decoder 152 to decode data bits, such as the various bits represented in FIG. 4. An upstream detector circuit 154 processes a recovered signal from the memory array 130 and presents the bits in the form of code words to the ECC decoder 152.

The ECC decoder applies an appropriate decoding algorithm in an effort to detect and resolve bit errors and return a copy of the originally stored data. The ECC decoder 152 and the detector 154 can be realized in hardware, software and/or firmware using any number of hardwired and/or programmable circuit configurations.

Figure 6:
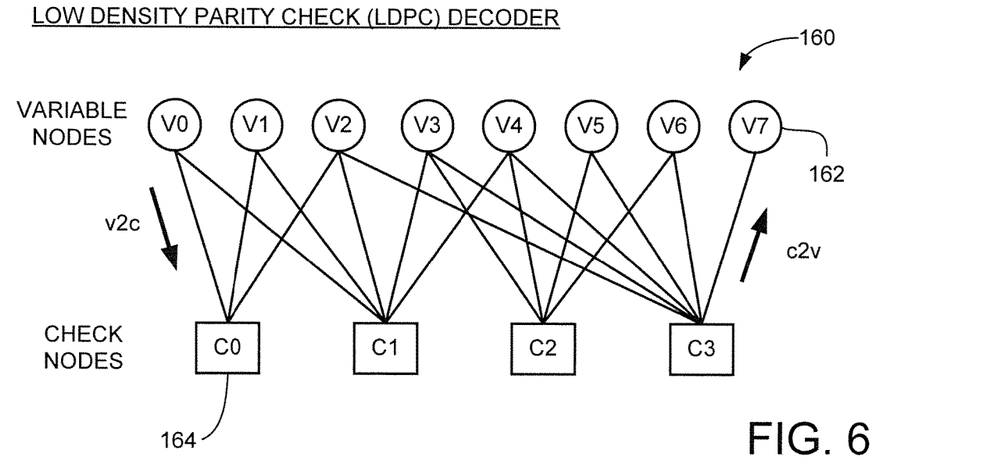
FIG. 6 is an interconnection (Tanner) diagram illustrating aspects of the ECC decoder of FIG. 5, characterized as a low density parity check (LDPC) decoder.

In some embodiments, the ECC decoder 152 takes the form of a low density parity check (LDPC) decoder. The LDPC decoder applies a min-sum or other suitable LDPC algorithm to the input code word. FIG. 6 provides a Tanner diagram 160 to illustrate aspects of the LDPC decoder. The decoder includes a number of variable node units (VNUs) 162, also referred to as variable nodes. A total of eight (8) variable nodes 132 are shown in FIG. 4, labeled as V0-V7, although in practice, many thousands of variable nodes may be used as required.

The variable nodes 162 communicate with a series of check node units (CNUs) or check nodes 164. A total of four check nodes are shown, labeled as C0-C3, but as before, many more check nodes may be used than those shown.

Input code bits are initially loaded to the variable nodes 162, along with, in at least some cases, additional information such as log-likelihood ratio (LLR) values. The data contents in the various variable nodes 162 are selectively combined to form v2c messages that are transferred to the corresponding check nodes 164. In FIG. 4, check node C0 receives bits from variable nodes V0, V1 and V2; check node C3 receives bits from variable nodes V2 through V7, and so on.

Once received, the v2c messages are evaluated by the check nodes using certain parity constraints to resolve the code word. In one example, the check nodes 164 may implement an even parity constraint so that all of the bits in a given v2c message should sum up to a 0 (even) value. Other parity constraints can be used.

Messages with these parity computational results are returned in the form of c2v messages. Generally, each iteration of the LDPC algorithm includes the generation and transfer of one set of v2c messages to the check nodes, followed by the return of one set of c2v messages to the variable nodes. If no errors are present, the resulting code word is resolved and the data are output as shown in FIG. 5. If at least one error is present, the values of the variable nodes 132 are updated using the c2v messages and, in some cases, other information. Subsequent iterations may be applied in an effort to resolve the code word.

Figure 7:
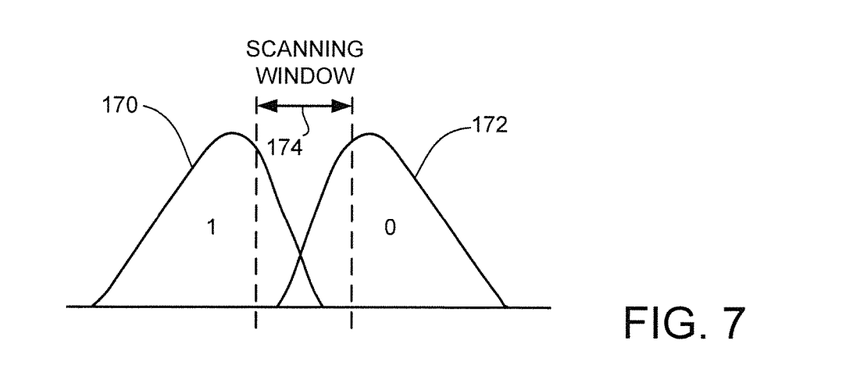
FIG. 7 shows a scanning window that may be used to differentiate different program states of the flash memory cells.

Bit errors may arise in the input code words for a variety of reasons. FIG. 7 shows a graphical representation of two adjacent charge distributions 170, 172 for a given population of memory cells. The first charge distribution 170 represents a program state of 1, and the second charge distribution 172 represents a program state of 0. A scanning window 174 represents a range of VREFs that may be applied in an effort to discern the actual charge state of a given cell during a scanning operation.

A bit error count is a total number of erroneous bits out of a set of data such as a code word. Bit error counts are often applied as a common metric during a VREF search operation. The bit error counts can be used in selecting a VREF value that minimizes the bit error count. However, without successful LDPC recovery, bit error counts are not normally easily discernable on the fly during the iterative processing of the LDPC decoder 152.

Figure 8:
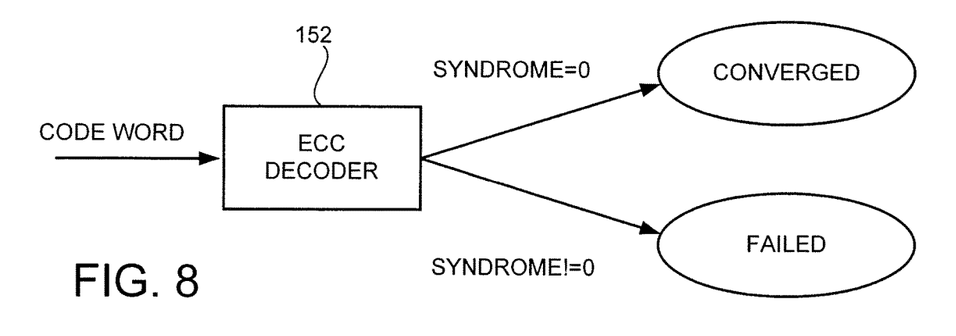
FIG. 8 depicts a decoding operation by the ECC decoder of FIG. 5.

A syndrome, or syndrome weight, is a count of the number of check nodes 164 that fail to converge after an LDPC decoding iteration. Similar syndrome weights may be calculated for other ECC decoders in relation to a number of elements or stages that fail the error correction check. As shown in FIG. 8, if an ECC decoder recovers a code word successfully, the syndrome weight (SW) at the output of the decoder operation will be zero (SW=0). Otherwise, the syndrome weight will be a positive integer (SW=!0). Generally, the syndrome weight will be a function of the number of applied ECC iterations, as well as other factors.

Figure 9:
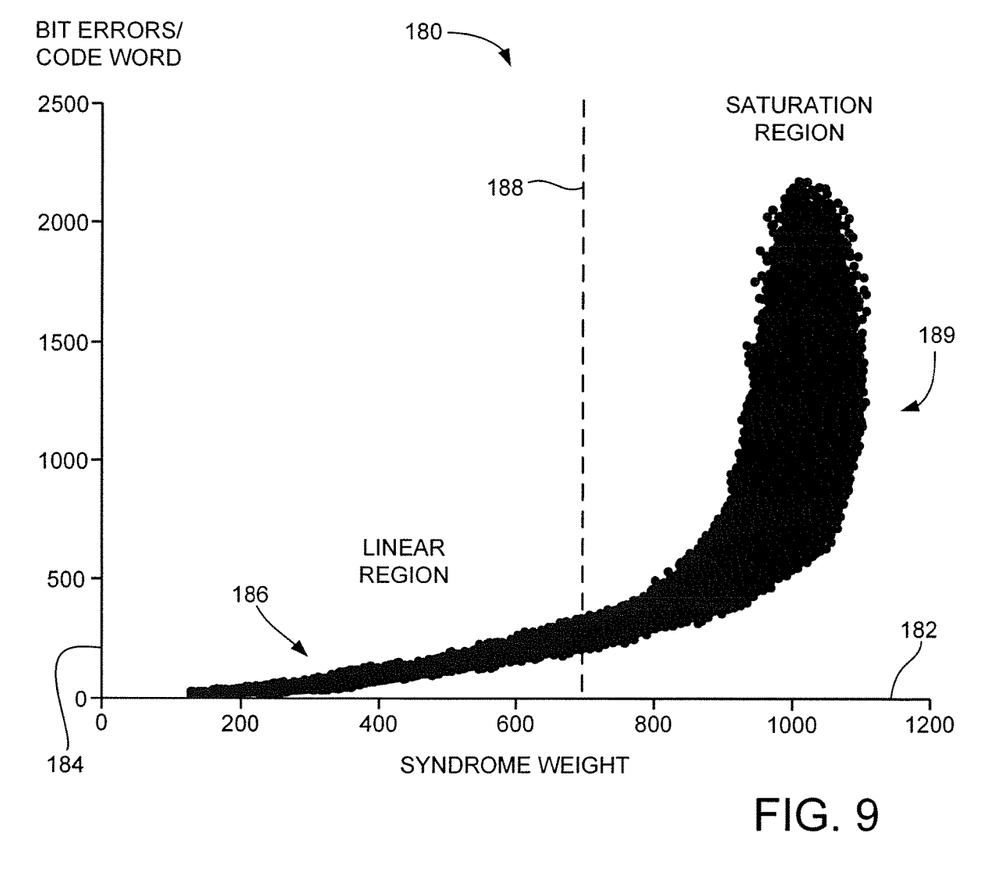
FIG. 9 shows a graphical relationship between bit errors and syndrome weight values during the decoding of FIG. 8.

It has been determined that the syndrome weight and the number of bit errors in a code word will have a positive correlation. FIG. 9 shows a data plot 180 of data points for various code words processed by the LDPC decoder of FIG. 6. Syndrome weight magnitude is represented along an x-axis 182 and the number of bit errors per code word is represented along a y-axis 184.

It can be seen that a substantially linear relationship exists between syndrome weight and bit error counts for small to medium syndrome weight values. Above a certain transitional syndrome weight, as generally represented by transition line 188, the relationship becomes saturated and bit errors increase at a significantly faster rate for increases in syndrome weight. The transition between the linear region and the saturation region is shown to occur for a syndrome weight of around 700, although other decoders may have a different characteristic transition point.

If the total number of bit errors in a given code word is too great, the syndrome weight will be pushed into the saturation region. When operating in this region, the syndrome weight will not contain enough information regarding the bit errors to help guide the VREF search operation depicted in FIG. 7 in an efficient manner.

Figure 10A:
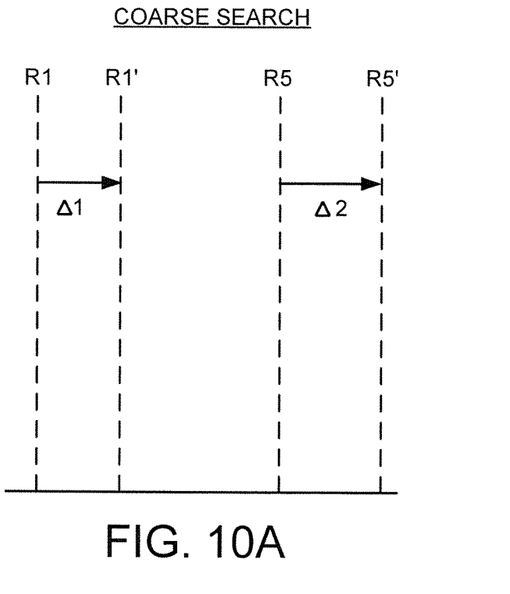
FIGS. 10A and 10B show simplified representations of coarse and fine search modes of the ECC decoder in some embodiments.
Figure 10B:
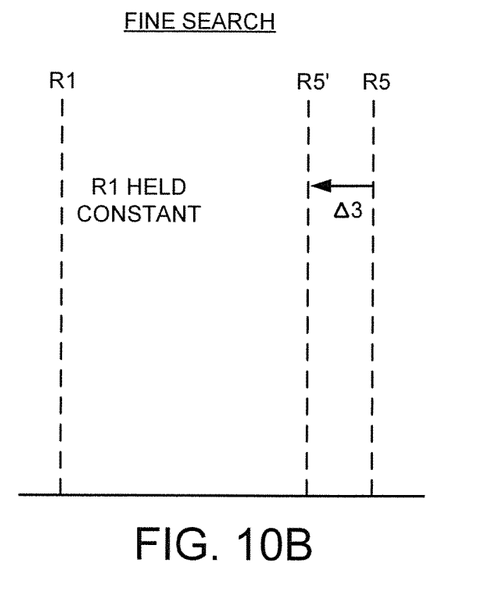

Accordingly, various embodiments of the present disclosure employ a multi-mode strategy for the VREF search operation during ECC decoding operations. The multi-mode strategy includes a coarse search mode, as generally represented by FIG. 10A, followed by a fine search mode, as generally represented by FIG. 10B. The goal of the coarse search is to bring the syndrome weight (and hence, the bit error count) back down to the linear region efficiently by shifting all of the relevant VREF values at the same time for each iteration. This is repeated until the syndrome weight is sufficiently reduced, after which the VREF values are individually adjusted as required during the fine search mode to resolve the code word.

As shown by FIG. 10A, two initial VREF values are represented by R1 and R5. Other combinations of VREF values can be used, so this is merely for illustration purposes. The values are concurrently incremented so that R1 is adjusted by an increment $\Delta 1$ to provide corresponding a new VREF value R1', and R5 is adjusted by an increment $\Delta 2$ to provide corresponding a new VREF value R5'. The respective increments $\Delta 1$ and $\Delta 2$ may be the same value, or may be different values. The same or different increments may be concurrently applied during each subsequent iteration. If the wrong polarity of increment is applied, this should be easily detected because an increase in syndrome weight may occur, allowing the system to quickly reverse the increment direction during the next iteration.

FIG. 10B shows that the VREF values are individually adjusted during the fine search mode; for example, R1 is maintained constant while R5 is adjusted by an increment $\Delta 3$. As before, additional increments will be made to R5 while R1 remains fixed. Once a final value for R5 has been determined, R5 will be maintained constant and increments will be made to R1. While not limiting, it is contemplated that the increments during the final search mode may be smaller in magnitude than the increments used during the coarse search.

Figure 11:
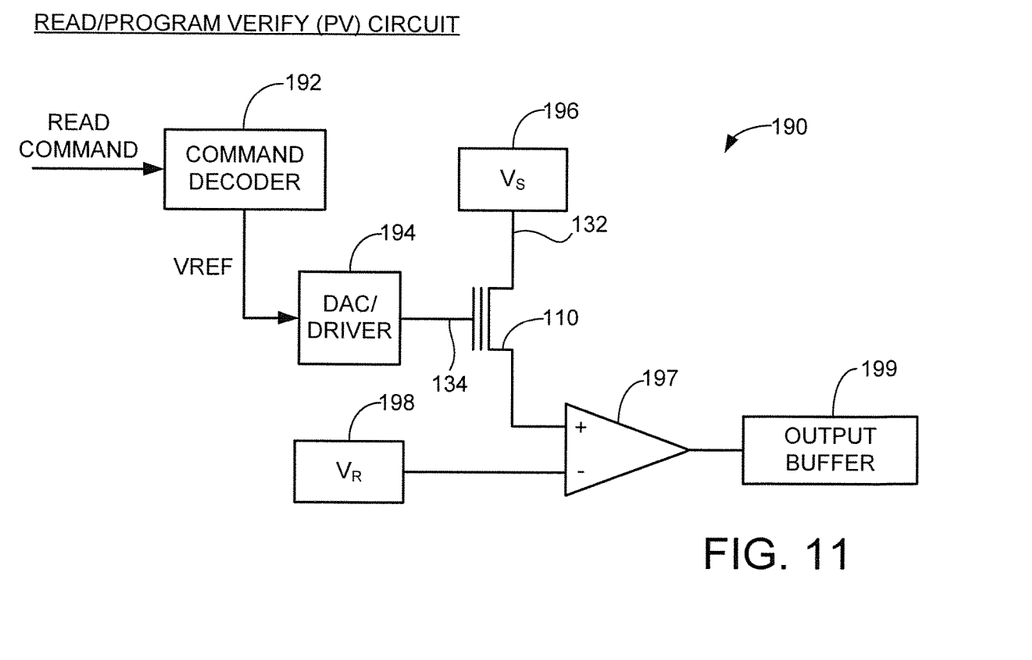
FIG. 11 shows a read/program verify circuit that can use the reference voltages from FIGS. 4 and 10A-10B in some embodiments.

FIG. 11 is a functional block representation of a read/program verify (PV) circuit 190 of the storage device 100 in accordance with some embodiments. The circuit 190 is adapted to apply the VREFs of FIGS. 4 and 10A-10B during read operations to output code bits from the memory. Program verify operations during programming can also be carried out by the circuit, or a different dedicated circuit having a similar construction can be used. The circuit configuration of FIG. 11 is merely to provide a concrete illustration, and so other circuit arrangements can be used as desired to generate code words using the VREF values. It will be appreciated that the circuit 190 may form a portion of the detector 154 in FIG. 5.

A command decoder 192 decodes an input read command and outputs the appropriate VREF value to a digital-to-analog (DAC) driver circuit 194. It is contemplated that each VREF value (e.g., R1, R5, etc.) will be stored in a memory in the form of a multi-bit digital value which is converted to a corresponding analog voltage level by the DAC 194. The amount of resolution in the various increments during the coarse and fine searching of FIGS. 10A-10B will ultimately be limited by the input bit resolution of the DAC.

The DAC/driver 194 applies the corresponding analog reference voltage to the control gate 120 of a selected cell 110 via the associated word line 134 (see FIGS. 2-3). A voltage source 196 applies a suitable source voltage $V_S$ to the bit line 132 coupled to the memory cell 110 being read. A sense amplifier 197 determines whether the applied voltage is sufficient to place the cell 110 into a conductive state through a comparison with another reference voltage $V_R$ from a reference voltage source 198. A resulting bit value (0 or 1) is output to an output buffer 199 responsive to the comparison.

Figure 12:
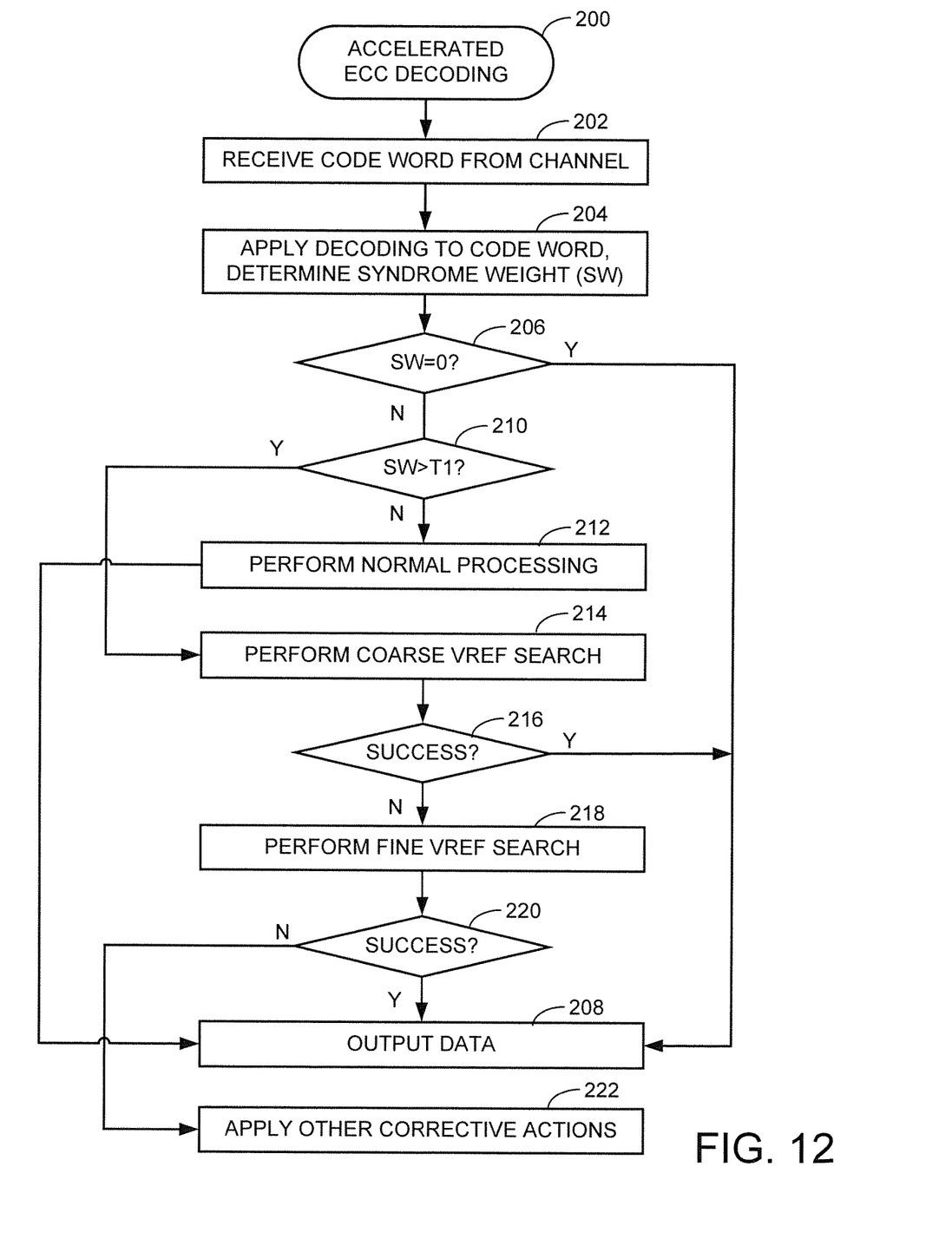
FIG. 12 is a flow chart for an accelerated ECC decoding routine.

FIG. 12 is a flow chart for an accelerated ECC decoding routine 200 carried out in accordance with some embodiments. The flow chart generally represents steps carried out by the system during the decoding of a selected code word, such as one retrieved from the memory 104. The steps may represent logic steps carried out by hardware circuitry, by programming instructions executed by one or more processors, or both, as required. To provide a concrete example, it will be contemplated the decoding takes place using an LDPC decoder as discussed above, although this is not limiting.

As shown at step 202, a selected code word is initially retrieved from a data channel such as discussed above in FIG. 11. Decoding is applied to the retrieved code word at step 204, including the processing of the various variable nodes and check nodes of the LDPC decoder 152 in an effort to resolve the parity checks of the check nodes. A syndrome weight (SW) value is calculated during this step.

Decision step 206 determines whether the syndrome weight is zero, indicative of the fact that the code word has been successfully decoded, that is, the bits stored in the variable nodes correctly represent the bits that were stored in the associated memory location. If so, the flow passes to step 208 where the code word is subjected to further processing to output the associated user data from the code word.

If the syndrome weight is non-zero, the flow passes to decision step 210 where a determination is made whether the syndrome weight is above a first threshold T1. While this step is optional, in some cases it is contemplated that this step will be carried out so that the coarse and fine searches of FIGS. 10A and 10B are only applied for syndrome weights above a predetermined value. If the syndrome weight is less than the specified threshold T1, which may correspond to line 188 in FIG. 9, normal processing may be applied to the code word by the LDPC decoder 152 in an effort to resolve the remaining bit errors (step 212). For this reason, the T1 threshold is sometimes referred to as an accelerated processing threshold.

When the syndrome weight exceeds the first threshold T1, the flow passes to step 214 where a coarse VREF search is carried out as explained below. If such searching results in the resolution of the code word, decision step 216, the flow passes to output data step 208. In most cases, however, it is contemplated that the internal criteria for exiting the coarse search mode will be reached, after which the flow passes to block 218 where the system transitions to the fine search mode. As before, successful resolution of the code word, decision step 220, will result in the outputting of the data. If the code word is not successfully resolved, the flow will pass to step 222 where other corrective actions may be applied, including the application of higher levels of error correction such as outer codes, etc.

Figure 13:
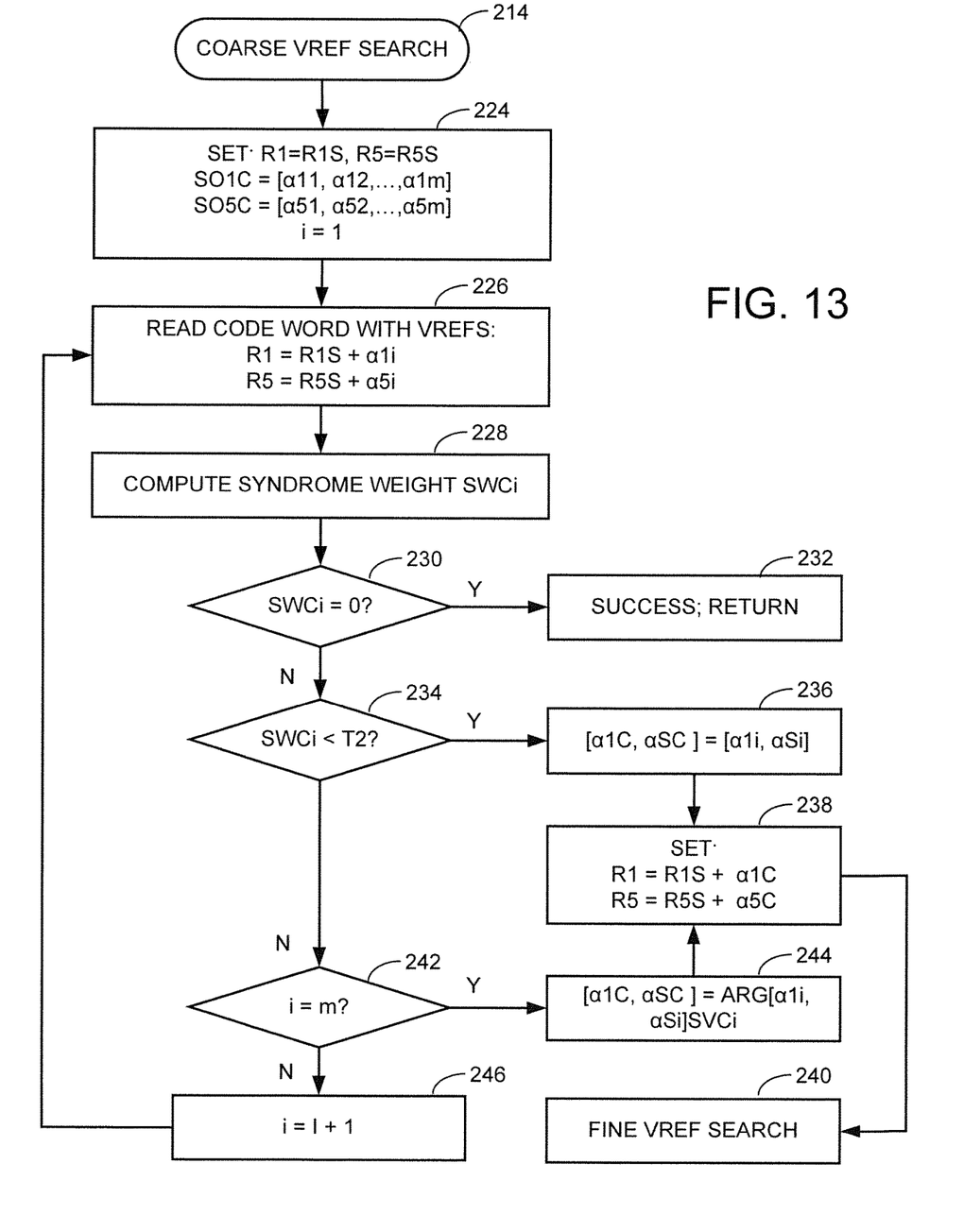
FIG. 13 is a flow chart for a coarse VREF search portion of the routine of FIG. 12.

FIG. 13 is a detailed flow chart for the coarse VREF search step 214 of FIG. 12 in some embodiments. As will be appreciated, the various steps are merely exemplary and are not limiting. As noted above, the minimum overall goal of the coarse search process is to bring the syndrome weight down to the linear region.

The flow contemplates page decoding using R1 and R5; other reference voltages may be used. Coarse search offsets for R1 and R5 are defined by SO1C=[$\alpha 11, \alpha 12, \ldots, \alpha 1m$] and SO5C=[$\alpha 51, \alpha 52, \ldots, \alpha 5m$], as represented at step 224. The search offsets for other reference voltages can be the same values, or can be different. The VREFs are first set with certain initial values (e.g., default VREF values), denoted as R1S and R5S. The first set of VREF offsets $\alpha 11$ and $\alpha 51$ are applied and the code word is read, step 226, and processed by the LDPC decoder. The coarse search syndrome weight SWCi is computed at step 228. The syndrome weight can be determined using the LDPC decoder directly or some other dedicated block(s), such as an H-matrix multiplier. It will be noted that the coarse search process is iterative over i iterations.

The coarse search process can be terminated if one of the following criteria is met. If SWCi reaches zero (SWCi=0), as shown by decision step 230, the code word has been successfully decoded (step 232), which means that the reference voltages were sufficient to allow decoding of the code word and the fine search is skipped. If the SWCi becomes less than a second threshold T2 (step 234), it can be presumed that the decoder has entered the linear region and the most current values for the reference voltages are used to begin the fine search mode (steps 236, 238, 240). For this reason, the T2 threshold is also sometimes referred to as an early termination threshold.

The early termination threshold T2 should be properly chosen to keep the balance between effectiveness and efficiency. This can be carried out empirically, through computer simulations, etc. The early termination threshold may be adaptively adjusted over time to fine tune performance. The early termination threshold can also be lifted to let the coarse scanning process go through the entire course (e.g., m iterations, decision step 242). After m iterations, the reference voltages are set per step 244 and fine searching begins (step 240). The reference voltages used to begin the fine search will use increments that provided the minimum syndrome weight, denoted as [$\alpha 1C, \alpha 5C$]. New increments during the coarse searching are provided by step 246.

Figure 14:
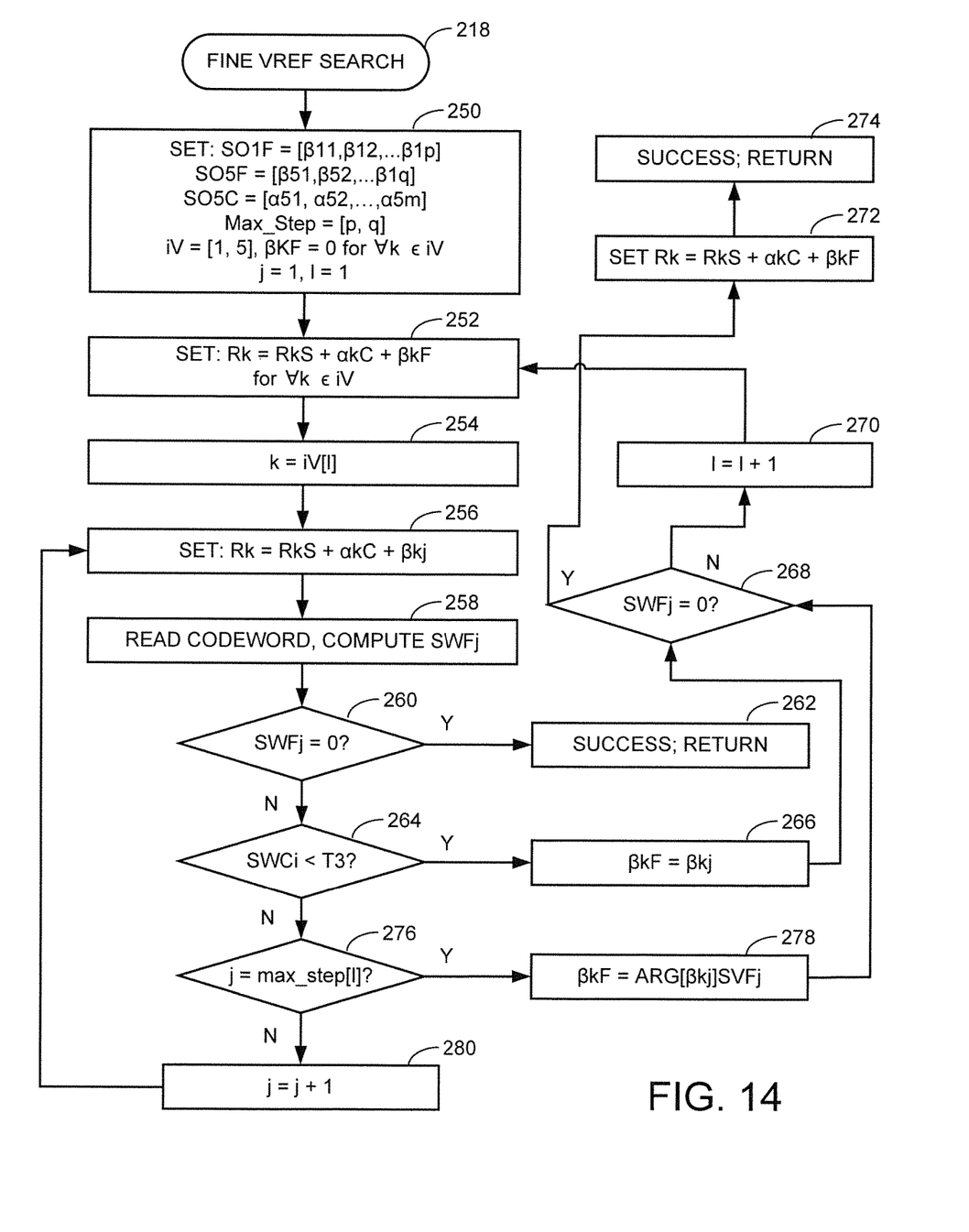
FIG. 14 is a flow chart for a fine VREF search portion of the routine of FIG. 12.

FIG. 14 shows the fine VREF search process of FIG. 12. As noted above, the overall goal of the fine search process is to further tune the VREF values to approach optimum values that, if not sufficient to resolve all bit errors, at least are sufficient to minimize the syndrome weight to allow additional processing to be applied to resolve the code word.

During the fine search, the search offsets for R1 and R5 are defined by SO1F=[$\beta 11, \beta 12, \ldots, \beta 1m$] and SO5F=[$\beta 51, \beta 52, \ldots, \beta 5m$], as indicated at step 250. As noted by this step, different reference voltages will have different increments, and may have different total numbers of respective searching steps p and q.

Unlike during the coarse search, the relevant VREFs R1 and R5 are scanned individually instead of being incremented together at the same time. For example, as represented at step 252, R5 is initially set as the coarse search result R5S+$\alpha$5C. R1 is then scanned within the fine search range SO1F. For each iteration, an additional offset $\beta 1k$ is applied during the code word reading operation (steps 254, 256), and a new fine search syndrome weight SWFj is determined, step 258.

Early termination criteria are applied to the fine search mode. If SWFj is found to be equal to zero (step 260), fine search is terminated and the current VREF values are used to extract the clean data, as well as potentially stored for use next time as the default read values (step 262).

If SWFj is non-zero but less than a third threshold T3 (step 264), the current offset β1k is selected as the final fine search offset for R1 (step 266). As before, the threshold T3 should be selected such that a code word with this syndrome weight can be easily decoded by further processing of the LDPC decoder 152. At this point the system determines whether the syndrome weight is zero (step 268).

If the syndrome weight is non-zero, the final increment value for the tested VREF value (in this case, R1) is saved and the process moves on to incrementally adjusting the next VREF value (in this case, R5), as indicated by step 270. If the syndrome weight is zero, the final increments are set at step 272 and the process returns at 274. For this reason, the T3 threshold is sometimes referred to as an exit threshold.

If no early termination criteria are met, once the final number of iterations is reached (step 276), the offset for the selected VREF value (R1) that minimizes the syndrome weight is selected (step 278) and the next VREF value (R5) is scanned (step 280). Because the fine searching generally operates in the linear region, gradient descent or hill climbing approaches can be used to accelerate the VREF optimization.

While the foregoing discussion has been directed to individual code words, the VREF optimization processing can be applied to other sizes of data structures such as multiple code words, an entire page of data, etc. Empirical testing on certain memory types has shown that the accelerated recovery scheme can reduce the maximum recovery time by 10X, and the need to use advanced ECC operations (such as outer code, etc.) by 2.5×.

Figure 15:
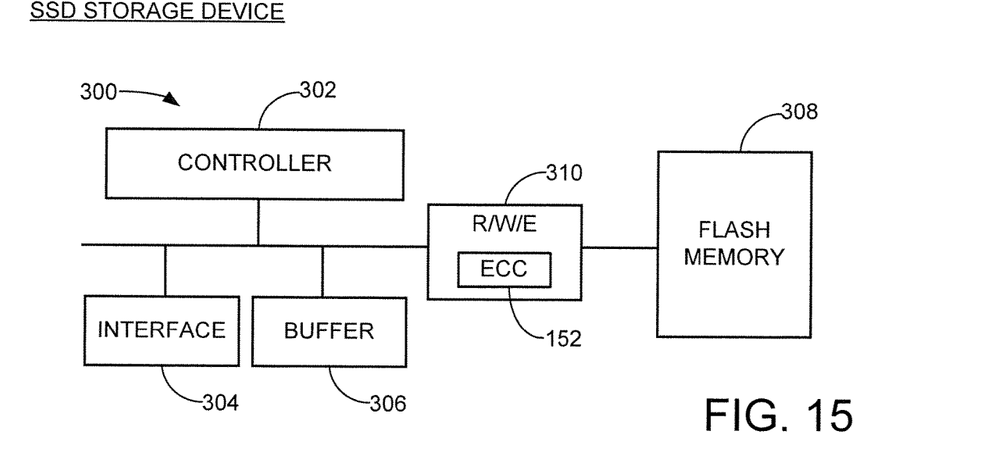
FIG. 15 is a functional block diagram of a solid state drive (SSD) type data storage device in which various embodiments may be advantageously practiced.
Figure 16:
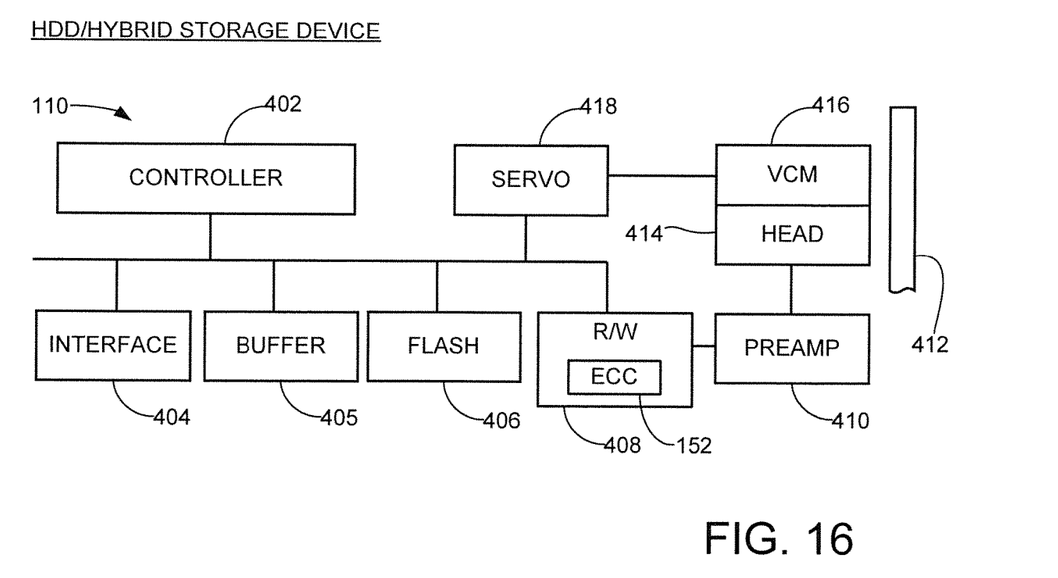
FIG. 16 is a functional block diagram of a hard disc drive (HDD) or hybrid type data storage device in which various embodiments may be advantageously practiced.

FIGS. 15 and 16 have been provided to illustrate further details regarding suitable environments for the use of the ECC decoders discussed herein, including LDPC decoders. FIG. 15 shows a functional block diagram for a solid state drive (SSD) data storage device 300 in accordance with some embodiments.

A controller circuit 302 provides top level control for the device 300 and may correspond to the controller 102 of FIG. 1. An interface circuit 304 and local buffer memory 306 coordinate the transfer of user data between an external host device and a flash memory 308. A read/write/erase circuit 310 performs the requisite encoding of input write data and directs the programming of the appropriate flash memory cells to write the encoded write data to the memory 308. During a read operation, the programmed data bits are recovered and subjected to processing by the ECC decoder 152 (which forms a portion of the R/W/E circuit 310) prior to transfer of the originally supplied data to the host. It will be appreciated that the various steps of the routines of FIGS. 12-14 may be carried out by the decoder in conjunction with a control circuit that interfaces with the decoder, such as but not limited to a control circuit of the associated R/W/E circuit 310, the controller 302, etc.

FIG. 16 provides a functional block diagram for a hard disc drive (HDD) or hybrid solid state drive (HSSD) storage device 400 in some embodiments. A controller circuit 402, interface circuit 404 and buffer memory 405 operate as in FIG. 15 to coordinate data transfers with a host device. A flash memory 406 provides local non-volatile semiconductor memory for storage of data. A read/write (R/W) channel 408 and preamplifier/driver (preamp) 410 support transfers of data to a rotatable recording medium (disc) 412 using a data read/write transducer (head) 414. Head position is controlled using a voice coil motor (VCM) 416 and a closed loop servo control circuit 418.

Data from the host may be stored to the flash 406 and/or the disc 412 as required. As before, the channel 408 encodes the data during a write operation, and uses ECC processing to recover the data during a subsequent read operation. Separate ECC decoders 152 may be used as required for the decoding of the data stored to the flash and disc. As before, the various steps of the routines of FIGS. 12-14 may be carried out by the decoder in conjunction with a control circuit that interfaces with the decoder, such as but not limited to a control circuit of the associated R/W circuit 408, the controller 402, etc.

It will now be appreciated that the various embodiments presented herein provide a number of benefits over the existing art. The use of a fast recovery process with coarse and fine searching modes can provide significant reductions in the time and processing required to resolve code words, particularly those with large initial syndrome weights.

It is contemplated although not required that the initial decode operation by the ECC decoder will be a hard decode using the then-existing VREF values and other channel parameters for the system, after which the syndrome weight will be evaluated and, if required, the coarse and fine searches will occur with subsequent re-reads of the code word from the memory. While the coarse and fine searches can be carried out as new retries, soft decode techniques can be utilized as well to further accelerate the process.

It is to be understood that even though numerous characteristics and advantages of various embodiments of the present disclosure have been set forth in the foregoing description, together with details of the structure and function of various thereof, this detailed description is illustrative only, and changes may be made in detail, especially in matters of structure and arrangements of parts within the principles of the present disclosure to the full extent indicated by the broad general meaning of the Willis in which the appended claims are expressed.

What is claimed is:

1. A method for decoding data, comprising:
applying at least two reference voltages to extract an initial code word representative of data stored in a memory;
using an error correction code (ECC) decoder to decode the initial code word;
determining an initial syndrome weight for the initial code word;
performing a coarse search by, over a first plurality of iterations, concurrently adjusting each of the at least two reference voltages to generate a succession of first updated code words, decoding the first updated code words using the ECC decoder and determining a corresponding syndrome weight for each of the first updated code words;
subsequently performing a fine search by, over a second plurality of iterations, individually adjusting each of the at least two reference voltages in turn to generate a succession of second updated code words, decoding the second updated code words using the ECC decoder and determining a corresponding syndrome weight for each of the second updated code words;

identifying final values for the at least two reference voltages that generate a selected one of the second updated code words having the minimum syndrome weight; and extracting a user data portion of the data stored in the memory using the final set of the at least two reference voltages.

2. The method of claim 1, wherein the ECC decoder is a low density parity check (LDPC) decoder having a plurality of variable nodes configured to store code bits of an associated code word and a plurality of check nodes configured to perform parity checks upon selected combinations of the code bits in the variable nodes, and wherein the syndrome weight is determined in relation to a total number of the check nodes that indicate unresolved errors remain the associated code word responsive to the parity checks.

3. The method of claim 2, wherein the LDPC decoder has a characteristic response of syndrome weights to bit errors comprising a nominally linear region for lower syndrome weights and a nominally saturated region for higher syndrome weights, wherein the coarse search is configured to transition the LDPC decoder from the saturated region to the linear region, and wherein the fine search is configured to resolve all or substantially all remaining bit errors in the code bits.

4. The method of claim 1, wherein each of the initial code word, the first updated code words, and the second updated code words comprises user data bits and redundancy bits, and wherein the ECC decoder operates to use the redundancy bits to identify and correct errors in the user data bits.

5. The method of claim 1, further comprising comparing the initial syndrome weight an accelerated processing threshold, and performing the coarse search responsive to the initial syndrome weight exceeding the accelerated processing threshold.

6. The method of claim 1, wherein the coarse search comprises adjusting a first reference voltage by a first increment to provide an adjusted first reference voltage, adjusting a second reference voltage by a second increment to provide an adjusted second reference voltage, and applying the adjusted first reference voltage and the adjusted second reference voltage to extract a selected code word from the memory.

7. The method of claim 1, wherein the memory comprises a flash memory, and the at least two reference voltages are applied to read the code words from the flash memory.

8. The method of claim 1, wherein each of the syndrome weights determined during the coarse search is compared to an early termination threshold, and wherein the fine search commences responsive to a selected one of the syndrome weights determined during the coarse search is less than the early termination threshold.

9. The method of claim 1, wherein the coarse search is performed for a predetermined number of iterations, and the fine search commences at a conclusion of the predetermined number of iterations using a selected set of the at least two reference voltages that provided a corresponding syndrome weight with a minimum value among the syndrome weights obtained during the coarse search.

10. The method of claim 1, wherein the minimum syndrome weight obtained during the fine search is a value of zero.

11. The method of claim 1, wherein the minimum syndrome weight is a non-zero positive value, and wherein the user data portion of the data stored in the memory is extracted using the final set of the at least two reference voltages to provide a final code word, and applying an outer code ECC value to the final code word.

12. A method for decoding data, comprising:
determining a syndrome weight for an initial code word extracted from a memory location using first and second reference voltages and decoded by an error correction code (ECC) decoder;

applying a fast recovery process responsive to the syndrome weight for the initial code word exceeding a predetermined threshold, the fast recovery process comprising a coarse search during which the first and second reference voltages are concurrently adjusted over a first plurality of iterations to extract each of a first set of subsequent code words from the memory location, followed by a fine search during which the first and second reference voltages are further individually adjusted in turn over each of a second plurality of iterations to extract each of a second set of subsequent code words from the memory location, each of the first and second sets of subsequent code words being decoded by the ECC decoder and a corresponding syndrome weight determined therefor; and decoding a user data portion of data stored at the memory location using a selected set of the first and second reference voltages that provided a selected syndrome weight with a minimum value.

13. The method of claim 12, further comprising performing a standard decoding process of the initial code word, responsive to the syndrome weight being less than the predetermined threshold, by individually adjusting the first and second voltage thresholds by different voltage intervals over each of a third plurality of iterations to remove bit errors from the user data bits of the LDPC code words.

14. The method of claim 12, wherein the LDPC decoder has a characteristic response of syndrome weights to bit errors comprising a nominally linear region for lower syndrome weights and a nominally saturated region for higher syndrome weights, wherein the predetermined threshold corresponds to a transition location between the linear region and the saturated region, and wherein the fast recovery process is configured to transition the LDPC decoder from the saturated region to the linear region.

15. The method of claim 12, wherein the reference voltages are applied to a non-volatile memory (NVM) to obtain individual bits of each of the code words from the NVM.

16. An apparatus comprising:
a low density parity check (LDPC) decoder comprising a plurality of variable nodes configured to store code word bits and a plurality of check nodes configured to perform parity checks upon selected combinations of the code word bits of the variable nodes; and a control circuit configured to resolve bit errors in a selected code word by determining a syndrome weight in relation to a total number of the check nodes that have unresolved parity errors during a first iteration of the LDPC decoder, and performing an accelerated decoding operation responsive to the syndrome weight exceeding a predetermined accelerated processing threshold by concurrently adjusting first and second reference voltages, applied to recover a subsequent copy of the selected code word over each of a first plurality of subsequent iterations during a coarse search mode, followed by individually adjusting the first and second reference voltages by different voltage intervals over each of a second plurality of subsequent iterations to remove bit errors from the user data bits of the selected code word during a fine search mode.

17. The apparatus of claim 16, wherein the LDPC decoder has a characteristic response of syndrome weights to bit errors comprising a nominally linear region for lower syndrome weights and a nominally saturated region for higher syndrome weights, wherein the accelerated processing threshold corresponds to a transition location between the linear region and the saturated region, and wherein the coarse search mode is configured to transition the LDPC decoder from the saturated region to the linear region.

18. The apparatus of claim 16, further comprising a non-volatile memory (NVM), wherein the control circuit directs application of the first and second reference voltages to the NVM to retrieve the code word bits of the selected code word.

19. The apparatus of claim 16, wherein the NVM comprises a flash memory comprising flash memory cells, each of the flash memory cells having $2^N$ different program states corresponding to N stored bits where N is greater than 1, and wherein the first and second reference voltages are configured to differentiate among the respective N stored bits in a group of the flash memory cells associated with the selected code word.

20. The apparatus of claim 16, wherein the control circuit is further configured to determine an updated syndrome weight over each of the first plurality of subsequent iterations during the coarse search mode, compare each of the updated syndrome weights to an early termination threshold, and transition from the coarse search mode to the fine search mode responsive to a most recent one of the updated syndrome weights falling below the early termination threshold.

21. The apparatus of claim 16, wherein the control circuit is further configured to apply a final set of the voltage references to generate a final code word at a conclusion of the fine search mode, the final code word comprising at least one remaining bit error, the control circuit further using an outer code error correction code to correct the at least one remaining bit error in the final code word.

* * * * *